(12) United States Patent
Minich

(10) Patent No.: US 7,387,535 B2
(45) Date of Patent: Jun. 17, 2008

(54) HINGED LEADFRAME ASSEMBLY FOR AN ELECTRICAL CONNECTOR

(75) Inventor: Steven E. Minich, York, PA (US)

(73) Assignee: FCI Americas Technology, Inc., Reno, NV (US)

( * ) Notice: Subject to any disclaimer, the term of this patent is extended or adjusted under 35 U.S.C. 154(b) by 0 days.

(21) Appl. No.: 11/612,976

(22) Filed: Dec. 19, 2006

(65) Prior Publication Data

US 2008/0003879 A1    Jan. 3, 2008

Related U.S. Application Data

(63) Continuation of application No. 11/480,045, filed on Jun. 30, 2006, now Pat. No. 7,309,257.

(51) Int. Cl.
*H01R 13/648*    (2006.01)
(52) U.S. Cl. .................. 439/608; 439/496; 439/701; 439/736
(58) Field of Classification Search ............ 439/595, 439/607, 353, 358, 571, 572, 608, 496, 701, 439/736
See application file for complete search history.

(56) References Cited

U.S. PATENT DOCUMENTS

| | | | |
|---|---|---|---|
| 4,687,267 A | 8/1987 | Header et al. ............... 439/62 |
| 4,846,727 A | 7/1989 | Glover et al. ............... 439/608 |
| 5,429,520 A | 7/1995 | Morlion et al. ............. 439/108 |
| 5,586,915 A | 12/1996 | Baker et al. ............. 439/733.1 |
| RE35,508 E | 5/1997 | Lemke et al. ............... 439/101 |
| 5,822,849 A | 10/1998 | Casali et al. ................. 29/827 |
| 5,993,259 A | 11/1999 | Stokoe et al. ............... 439/608 |
| 6,071,152 A | 6/2000 | Achammer et al. ...... 439/733.1 |
| 6,083,047 A | 7/2000 | Paagman ................... 439/608 |
| 6,171,149 B1 * | 1/2001 | van Zanten ................. 439/608 |
| 6,299,492 B1 | 10/2001 | Pierini et al. ............... 439/884 |
| 6,390,857 B1 | 5/2002 | Pickles et al. .............. 439/680 |
| 6,641,438 B1 | 11/2003 | Billman et al. ............. 439/608 |
| 6,666,692 B2 | 12/2003 | Billman et al. ............ 439/76.1 |
| 6,682,369 B1 | 1/2004 | Korsunsky et al. ......... 439/608 |
| 6,712,646 B2 | 3/2004 | Shindo ....................... 439/608 |

(Continued)

FOREIGN PATENT DOCUMENTS

EP    1 317 023 B1    7/2005

*Primary Examiner*—Michael C Zarroli
(74) *Attorney, Agent, or Firm*—Woodcock Washburn LLP

(57) ABSTRACT

An electrical connector is disclosed with a connector housing and a leadframe assembly received in the connector housing. The leadframe assembly may include a dielectric leadframe housing and first and second electrically-conductive contacts extending through the leadframe housing. Each of the contacts may define a respective broadside and a respective mating end. The leadframe housing may define a hinge between the mating ends of the first and second contacts. The leadframe housing may be folded along the hinge such that the broadside of the first contact is positioned along the broadside of the second contact. A method for manufacturing such an electrical connector may include stamping a leadframe from a sheet of electrically-conductive material, overmolding a hinged, leadframe housing onto the leadframe, folding the leadframe along the hinge such that a face of a first contact is positioned along a face of a second contact, and inserting the folded leadframe assembly into a connector housing such that the leadframe assembly is retained in the connector housing in a folded configuration.

35 Claims, 11 Drawing Sheets

U.S. PATENT DOCUMENTS

| | | |
|---|---|---|
| 6,746,278 B2 | 6/2004 | Nelson et al. .............. 439/608 |
| 6,835,103 B2 | 12/2004 | Middlehurst et al. .... 439/699.1 |
| 6,884,117 B2 | 4/2005 | Korsunsky et al. ......... 439/607 |
| 6,890,214 B2 | 5/2005 | Brown et al. ............... 439/608 |
| 6,918,789 B2 | 7/2005 | Lang et al. ................. 439/608 |
| 2004/0224559 A1 | 11/2004 | Nelson et al. .............. 439/608 |
| 2006/0245137 A1 | 11/2006 | David |

* cited by examiner

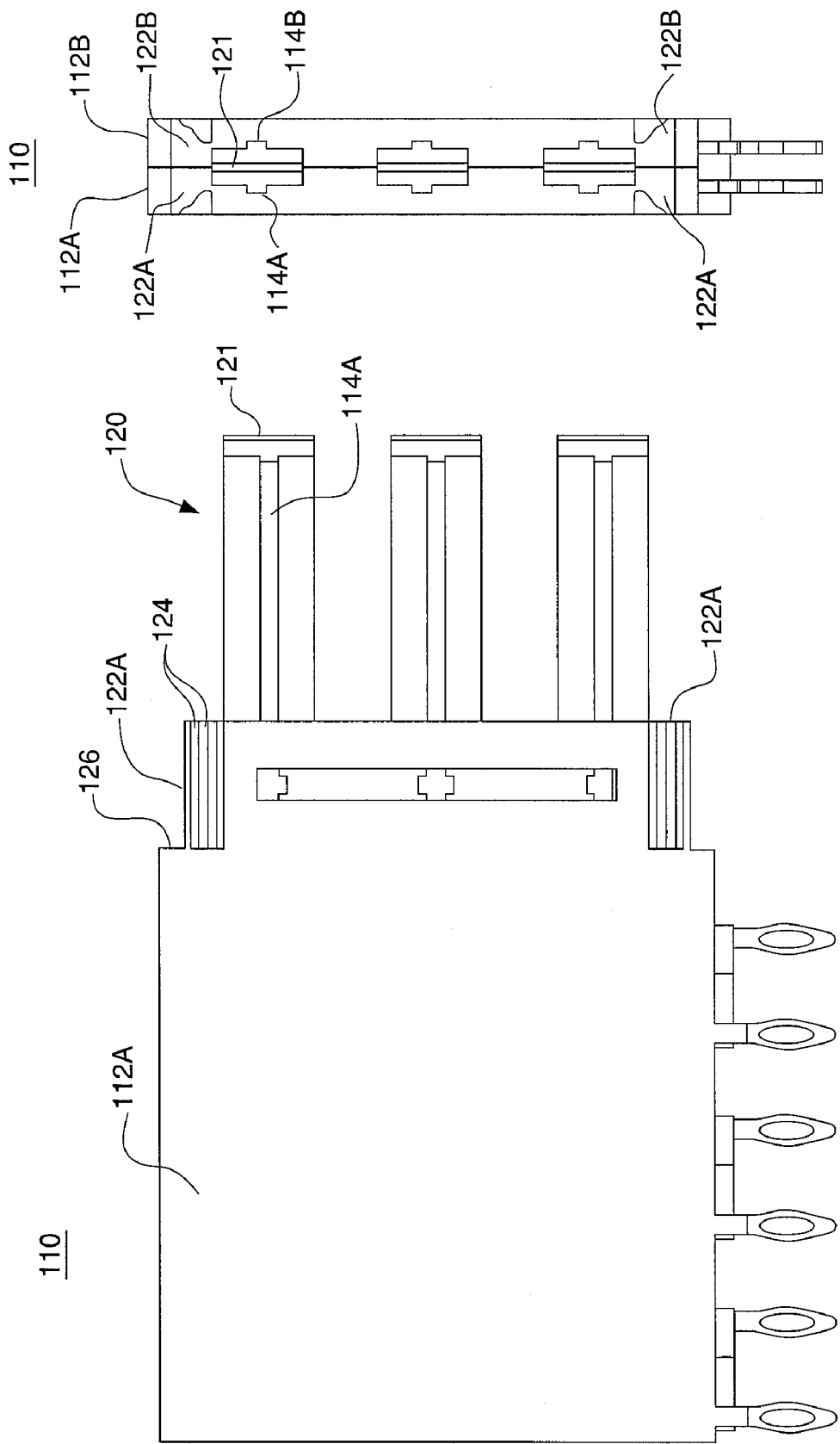

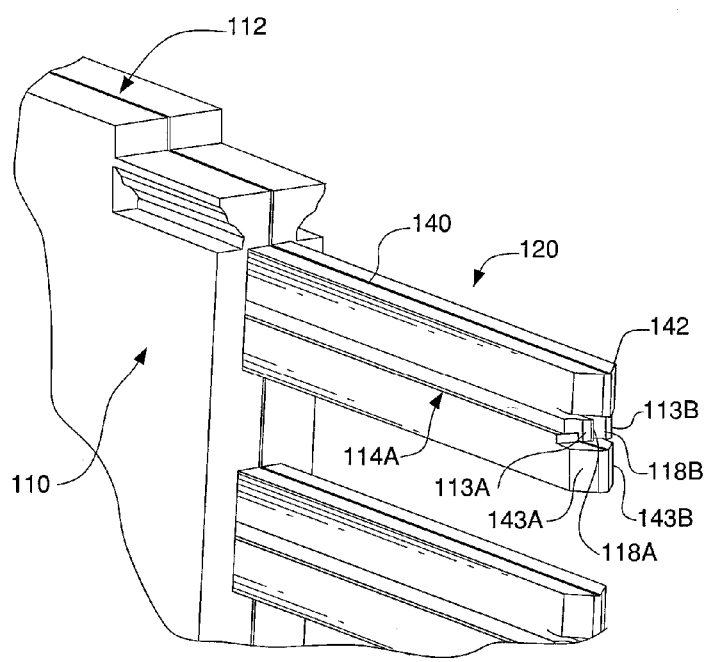
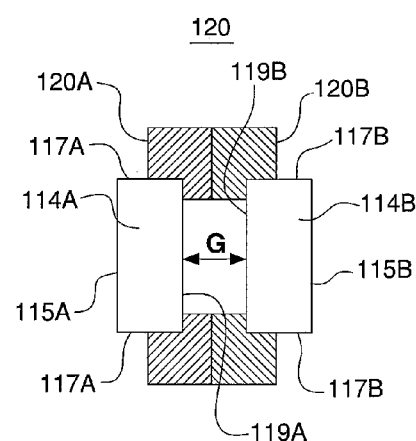
FIG. 3A
FIG. 3B

HINGED LEADFRAME ASSEMBLY FOR AN ELECTRICAL CONNECTOR

CROSS-REFERENCE TO RELATED APPLICATIONS

This application is a continuation of U.S. patent application Ser. No. 11/480,045,filed Jun. 30, 2006, now U.S.Pat. No. 7,309,257, the disclosure of which is incorporated herein by reference.

BACKGROUND OF THE INVENTION

Leadframe assemblies for electrical connectors are well-known. A typical leadframe assembly includes a dielectric leadframe housing and a leadframe comprising a plurality of electrical contacts extending therethrough. An insert-molded leadframe assembly (IMLA) may be manufactured according to a process wherein a leadframe is stamped from a sheet of electrically-conductive material, and a dielectric material is insert-molded over the leadframe.

Typically, the electrical contacts within a leadframe assembly are arranged into a linear array that extends along a direction along which the leadframe housing is elongated. The contacts may be arranged edge-to-edge along the direction along which the linear array extends. It may be desirable to form differential signal pairs wherein the contacts that form the pair are broadside-coupled (i.e., arranged in different planes such that the broadside of one contact faces the broadside of the other contact with which it forms the pair). Broadside coupling is often desirable as a mechanism to control (e.g., minimize or eliminate) skew between the contacts that form the differential signal pair.

Typically, such broadside-coupled signal pairs are formed in an electrical connector by placing two IMLAs side by side. Thus, a first contact in a first IMLA may be positioned adjacent to a first contact in a second IMLA such that respective broadsides of each contact face one another. An example of a split-IMLA configuration for broadside-coupled electrical contacts may be found in U.S. patent application Ser. No. (FCI-2735), the disclosure of which is incorporated herein by reference.

To manufacture such an electrical connector, a separate leadframe is typically stamped for each IMLA. Respective dielectric housings are then insert-molded separately onto each of the leadframes. The leadframe assembly/IMLAs may be connected to one another or separate from one another. The leadframe assemblies are then inserted into a connector housing that holds them in place.

It is usually desirable to maintain a desired impedance between the contacts the form a pair, and to maintain a constant differential impedance profile along the lengths of the contacts from their mating ends to their mounting ends. Accordingly, it is usually desirable to align the broadsides of the contacts as nearly as possible with one another, and to maintain the distance between the broadsides of the contacts to within as small a tolerance as possible. It would be desirable to increase the efficiency of such manufacturing process, thereby reducing cost, while improving tolerance control to improve signal integrity.

SUMMARY OF THE INVENTION

A leadframe assembly for an electrical connector may include a dielectric leadframe housing, and first and second electrically-conductive contacts extending through the leadframe housing. Each of the contacts may have a respective mating end. The leadframe housing may define a hinge between the mating ends of the first and second contacts.

An electrical connector according to the invention may include a connector housing and a leadframe assembly received in the connector housing. The leadframe assembly may include a dielectric leadframe housing and first and second electrically-conductive contacts extending through the leadframe housing. Each of the contacts may define a respective broadside and a respective mating end. The leadframe housing may be folded along a hinge between the mating ends of the first and second contacts such that the broadside of the first contact is positioned along the broadside of the second contact.

A method for manufacturing an electrical connector may include stamping a leadframe from a sheet of electrically-conductive material. The leadframe may include first and second electrically-conductive contacts, each having a respective mating end. A dielectric leadframe housing may be overmolded onto the leadframe. The leadframe housing may define a hinge between the mating ends of the first and second contacts. The leadframe housing may be folded along the hinge such that a face of the first contact is positioned along a face of the second contact. The folded leadframe assembly may be inserted into a connector housing such that the leadframe assembly is retained in the connector housing in a folded configuration.

BRIEF DESCRIPTION OF THE DRAWINGS

FIGS. 2A-2C are, respectively, isometric, side, and mating end views of an example hinged leadframe assembly.

FIG. 3A includes an isometric view of a mating portion of an example hinged leadframe assembly.

FIG. 3B is a cross-sectional view of a mating portion of an example hinged leadframe assembly.

DETAILED DESCRIPTION OF ILLUSTRATIVE EMBODIMENTS

Figure 1:
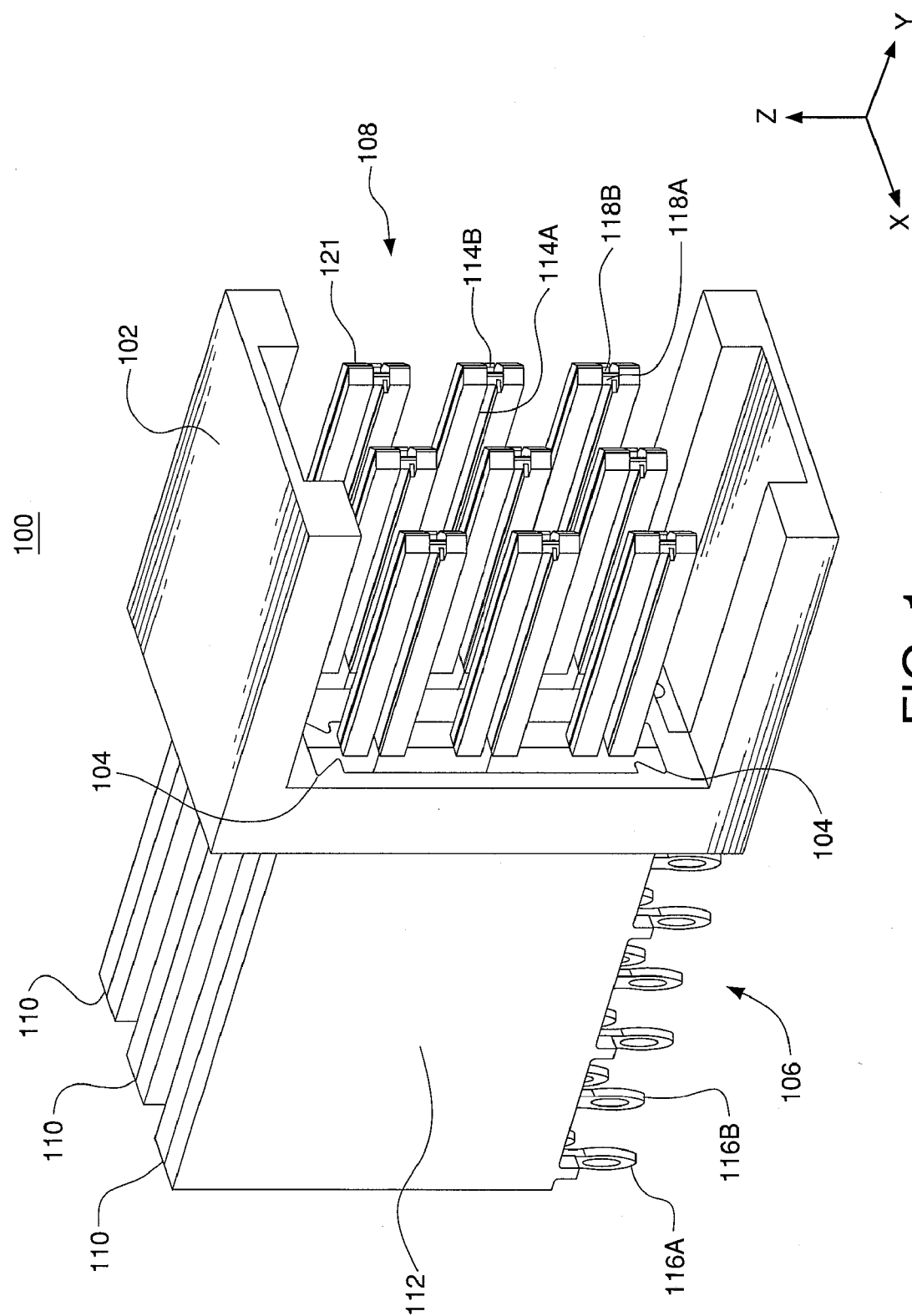
FIG. 1 is an isometric view of an example connector having hinged leadframe assemblies according to one embodiment of the present invention.

FIG. 1 is an isometric view of an example connector 100 having a plurality of hinged leadframe assemblies 110 contained by a connector housing 102. The connector housing 102 may be made of a dielectric material, such as a plastic, for example. Though the connector 100 is shown with three leadframe assemblies 110, it should be understood that the connector may include any number of leadframe assemblies 110.

Each leadframe assembly 110 may include a hinged leadframe housing 112 that defines a hinge 121. The hinged leadframe housing 112 may be made of a dielectric material, such as a plastic, for example. A plurality of electrical contacts 114A, 114B may extend through the leadframe housing 112. The electrical contacts 114A, 114B may be made of an electrically-conductive material, such as phosphor bronze, for example.

Each leadframe assembly 110 may include a first linear array of electrical contacts 114A extending along a first imaginary plane, and a second linear array of electrical contacts 114B extending along a second imaginary plane that is parallel to the first imaginary plane. The contacts 114A, 114B may be arranged into differential signal pairs. Each pair may be positioned along an imaginary plane that is generally perpendicular to the imaginary planes along which the first and second linear arrays of electrical contacts extend. Each linear array may be referred to herein as a contact column. A contact row may be said to extend perpendicular to the contact columns. Accordingly, the connector 100 depicted in FIG. 1 may be said to include six columns and three rows of electrical contacts. Though each leadframe 110 is shown to include three pairs of electrical contacts 114A, 114B, it should be understood that each leadframe assembly 110 may include any number of electrical contacts.

Each of the electrical contacts 114A, 114B may define a respective mounting end 116A, 116B and a respective mating end 118A, 118B. The mounting ends 116A, 116B may be compliant ends, as shown, though it should be understood that the mounting ends may be any press-fit, through-mount, or surface-mount tail end. Each of the mounting ends may include a respective fusible mounting element (not shown), such as a solder ball, for example. The mating ends 118A, 118B may be gold-plated.

The connector 100 may define a mounting side 106 and a mating side 108. The connector 100 may be a right-angle connector, as shown, wherein the plane define by the mounting side 106 is generally perpendicular to the plane defined by the mating side 108. It should be understood, however, that the principles of the invention could be applied to a mezzanine-style connector, wherein the plane defined by the mounting side 106 is generally parallel to the plane defined by the mating side 108.

Figure 2A:
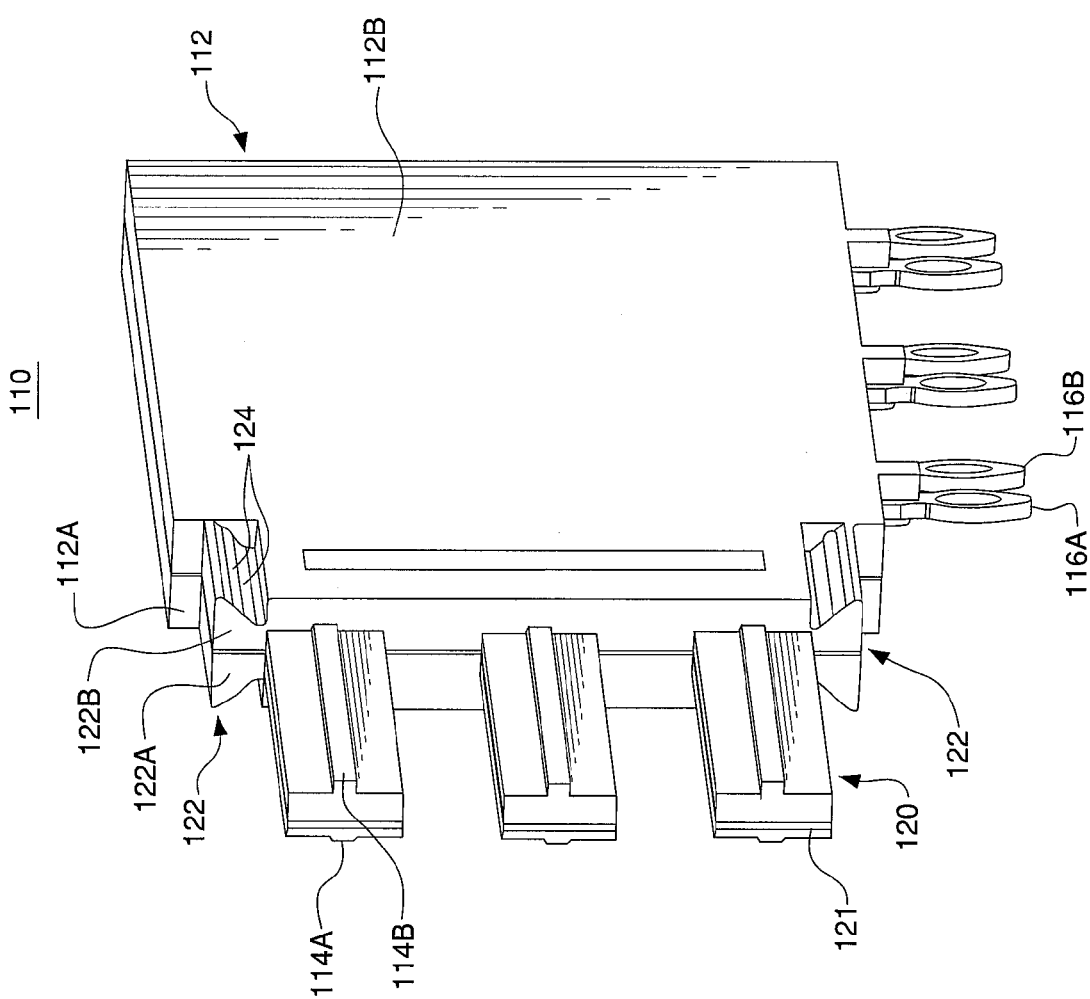

FIGS. 2A-2C are, respectively, isometric, side, and mating end views of an example hinged leadframe assembly 110. As shown, the leadframe housing 112 may include a first portion 112A and a second portion 112B. A first column of electrical contacts 114A may extend through the first portion 112A of the leadframe housing 112. A second column of electrical contacts 114B may extend through the second portion 112B of the leadframe housing 112. The first portion 112A and the second portion 112B of the leadframe housing 112 may be connected via a hinge 121 defined by a hinged portion 120 of the leadframe housing 112. The first portion 112A and the second portion 112B may be otherwise unconnected. The hinged portion 120 may define a mating end of the leadframe housing 112.

The leadframe housing 112 may include a dovetail 122. The dovetail 122 may be a split dovetail. That is, the first portion 112A of the leadframe housing 112 may include a first portion 122A (preferably half) of the dovetail 122. The second portion 112B of the leadframe housing 112 may include a second portion 122B (also preferably half) of the dovetail 122. The leadframe housing 120 may include a first dovetail 122 proximate a first (e.g., upper) end of the leadframe assembly 110, and a second dovetail 122 proximate a second, opposite (e.g., lower) end of the leadframe assembly 110.

As shown in FIG. 1, the connector housing 102 may define one or more dovetail receptacles 104 that are complementary to the one or more dovetails 122. That is, the dovetail receptacles 104 may be positioned, sized, and shaped to receive a corresponding dovetail 122. The dovetail receptacles 104 may be sized and shaped such that, with the dovetails 122 received into the dovetail receptacles 104, the leadframe assembly 110 is contained in the non-inserting directions. Walls defined by the connector housing 102 tend to contain the leadframe assemblies 110 in the directions along which the contact rows and columns extend (i.e., the ±x and ±z directions shown in FIG. 1).

As shown in FIG. 2B, the leadframe housing 112 may also define a stop 126 that, when the leadframe housing 112 is fully seated in the connector housing 102 (see FIG. 1), the stop 126 abuts a surface (not shown) defined by the connector housing 102. Thus, the leadframe assembly 110 may be contained in the mating direction (i.e., the +y direction shown in FIG. 1). Interference fits between the dovetails 122 and dovetail receptacles 104 tend to further contain the leadframe assemblies in the mating direction and the direction opposite the mating direction (i.e., the −y direction shown in FIG. 1).

Each dovetail 122 may include one or more protrusions 124. Such protrusions 124 allow for some flexibility in the size and shape of the dovetail receptacles 104. Thus, the dovetail receptacles 104 do not have to be exact complements of the dovetails 122.

FIG. 3A includes a detailed isometric view of a mating portion 120 of an example hinged leadframe assembly 110. FIG. 3B is a cross-sectional view of the mating portion 120 taken transverse to the direction along which the mating portion 120 is elongated. Each contact 114A, 114B may have a respective mating portion having a broadside 119A, 119B, and respective edges 117A, 117B that extend from the broadsides 119A, 119B, perpendicular thereto.

As shown, adjacent contacts 114A, 114B within the mating portion 120 may be aligned broadside 119A to broadside 119B. Adjacent contacts 114A, 114B within the mating portion 120 may form a broadside-coupled differential signal pair. It should be understood that adjacent contacts within the mating portion 120 may be aligned edge-to-edge, and may form an edge-coupled differential signal pair.

The mating portion 120 of the leadframe assembly 110 may include a mating portion 140 of the leadframe housing 112. The mating end 142 of leadframe housing 112 may extend farther in the mating direction (i.e., the direction along which the contacts 114A, 114B extend to be received into complementary receptacle contacts) than the mating ends 118A, 118B of the contacts 114A, 114B. The mating portion 140 of the leadframe housing 112 may be recessed such that the mating ends 118A, 118B of the contacts 114A, 114B extend out of the dielectric material. The outer broadsides 115A, 115B of the contacts 114A, 114B may extend beyond the outer faces 120A, 120B of the mating portion 120 of the leadframe housing 112, as shown. Alternatively, the outer broadsides 115A, 115B of the contacts 114A, 114B may be flush with the outer faces 120A, 120B of the mating portion 120 of the leadframe housing 112. The dielectric material that forms the mating portion 120 of the leadframe housing 112 may extend over the inner broadsides 119A, 119B of the electrical contacts 114A, 114B, as shown, or over the outer broadsides 115A, 115B of the electrical contacts 114A, 114B (not shown). The mating ends 118A, 118B of the contacts 114A, 114B may have one or more angled surfaces 113A, 113B that provide for lead-in to complementary receptacle contacts. The mating end 142 of the leadframe housing 112 may also have one or more angled surfaces 143A, 143B that provide for lead-in to complementary receptacles in the receptacle connector.

The lead portions of the adjacent contacts 114A, 114B in the mating portion 120 of the leadframe assembly 110 define a gap G between them. The gap G has a gap width that, preferably, is as small as possible. For example, the gap width may be about 0.2-0.6 mm in air, with 0.4 mm preferred for a 0.3 mm wide contact. In plastic, the gap width will be greater. Moreover, if the contact width decreases, the gap width decreases. Each contact 114A, 114B may have a single-ended impedance. Connectors having single-ended impedance of about 50 ohms are contemplated. The pair of contacts 114A, 114B may have a differential impedance. Connectors having differential impedances of 85±10% ohms, and 100±10% ohms are contemplated. Differential impedance may be affected by how well the contacts are aligned relative to one another. Gap width may also affect differential impedance. Conductor width and dielectric also affect differential impedance.

Figure 4A:
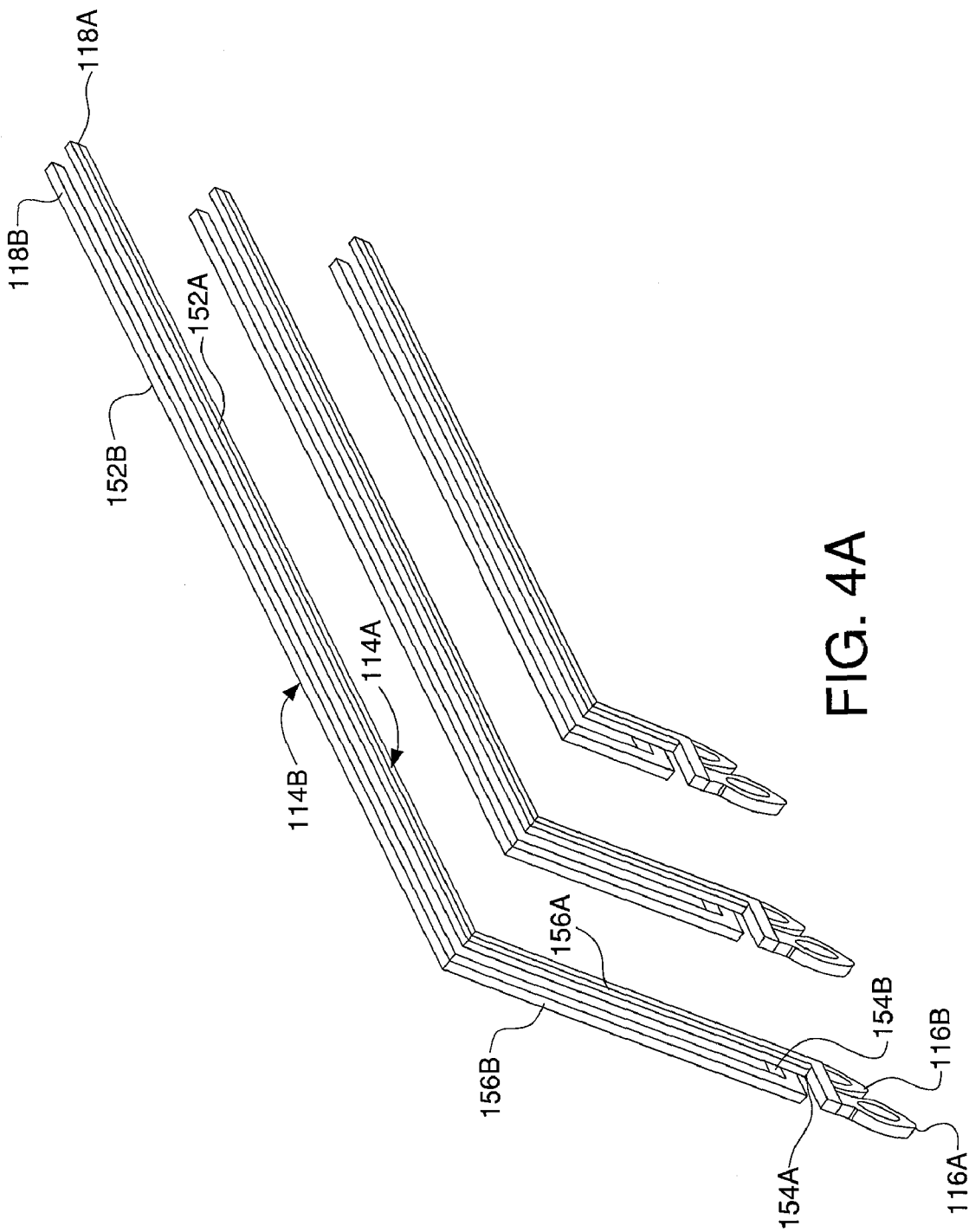
FIGS. 4A and 4B are, respectively, isometric and side views of an example array of electrical contacts arranged as broadside-coupled signal pairs.
Figure 4B:
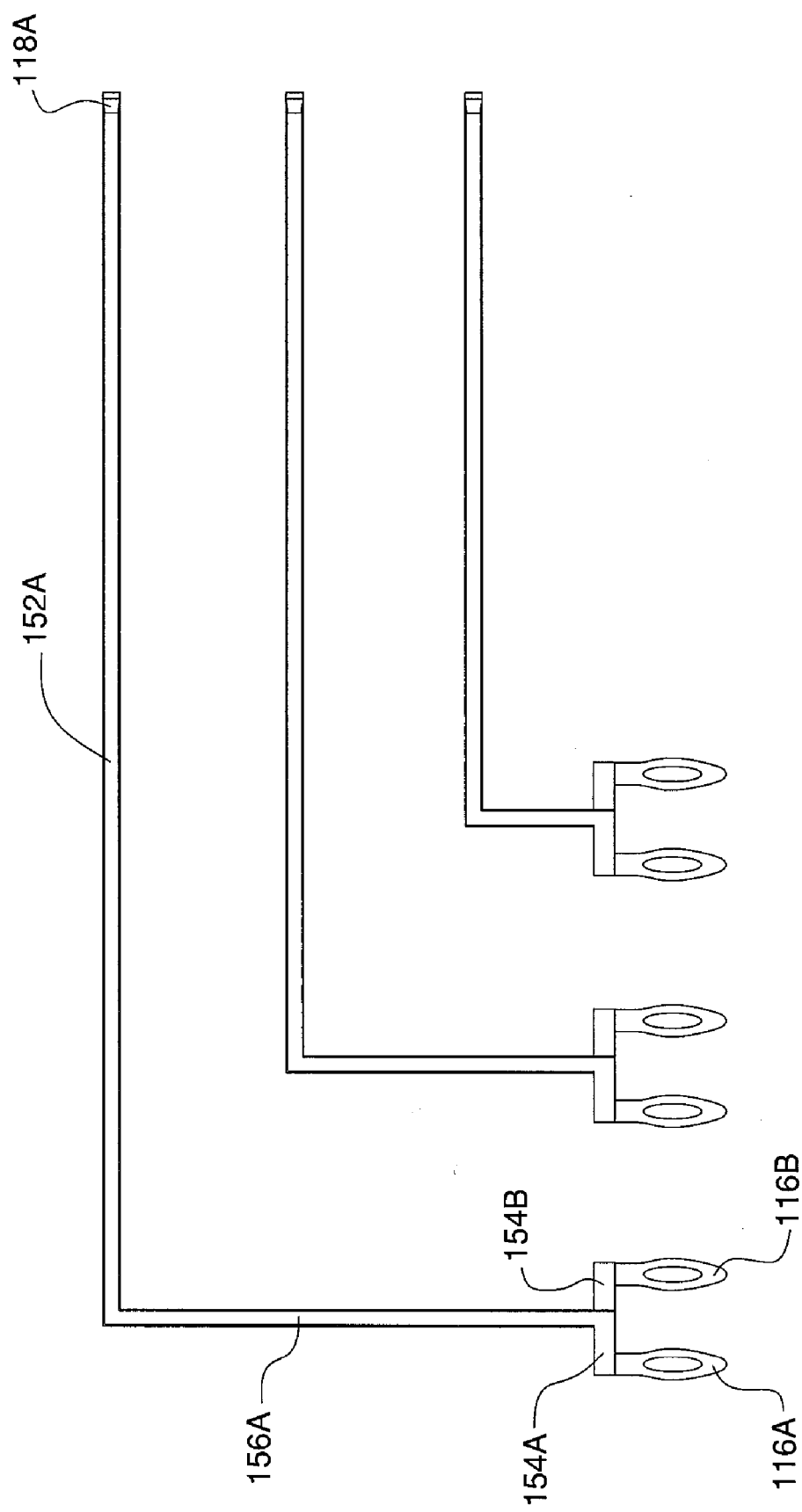

FIGS. 4A and 4B are, respectively, isometric and side views of an example array of electrical contacts arranged as broadside-coupled differential signal pairs. As shown, each contact 114A, 114B may have a respective mating end 118A, 118B, a respective first lead portion 152A, 152B extending from the mating end 118A, 118B, a respective mounting portion 154A, 154B, and a respective second lead portion 156A, 156B extending from the mounting portion 154A, 154B. The first lead portion 152A, 152B may form a right angle with the second lead portion 156A, 156B.

Each first lead portion 152A, 152B, and each second lead portion 156A, 156B may be rectanguloidal in shape, having a broadside and an edge in transverse cross-section. The broadside may have a length that is about twice the length of the edge, though the ratio of broadside length to edge length may be any desired ratio. Alternatively, the transverse cross-section of each lead portion may be square, with each side having the same length.

In order to optimize the connector footprint, it may be desirable to separate the mounting ends 116A, 116B of adjacent contacts 114A, 114B by a sufficient amount such that the receiving members (e.g., throughholes, pads, plated vias, etc.) on the printed circuit board need not be too close together. By jogging the mounting portions 154A, 154B of the contacts 114A, 114B by an equal and opposite distance, the contacts 114A, 114B that form a pair may be kept the same length (from mating end to mounting end) to avoid skew between them. As shown, the mounting portion 154A of a first contact 114A may extend a first distance in a first direction perpendicular to the first lead portion 152A of the first contact 114A. The mounting portion 154B of a second, adjacent contact 114B may extend perpendicular to the first lead portion 152B of the second contact 114B the same distance in a direction opposite the first direction.

Figure 5A:
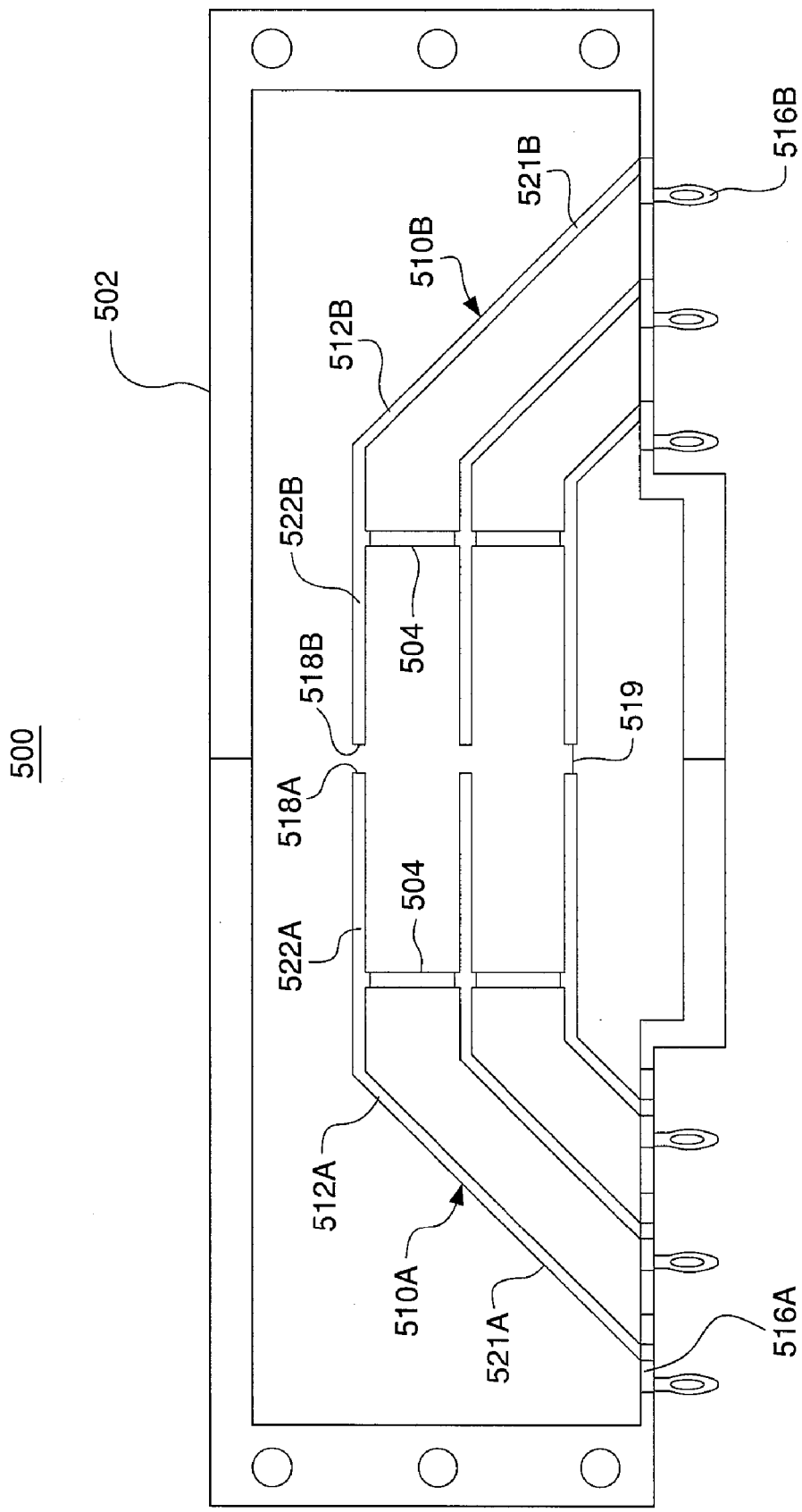
FIGS. 5A-5D depict an example method for manufacturing a hinged lead frame assembly.

FIGS. 5A-5D depict an example method for manufacturing a hinged lead frame assembly. FIG. 5A depicts a carrier strip 500 comprising a first leadframe 510A comprising three electrical contacts 512A and a second leadframe 510B comprising three electrical contacts 512B. Each leadframe 510A, 510B will form a respective contact column within a respective leadframe assembly. At this stage in the manufacturing process, the contacts 512A, 512B may be connected to one another via a carrier frame 502. Connectors 504 may be provided to connect the lead portions of the contacts to one another. The carrier strip 500 may be stamped from a sheet of electrically-conductive material via well-known techniques. The sheet may have a thickness of about 0.1-0.4 mm, with 0.2 mm preferred. Respective gaps 519 may be defined between the mating ends 518A of the contacts 512A in leadframe 510A and the mating ends 518B of corresponding contacts 512B in leadframe 510B. The gaps 519 may be similar to the sheet thickness or greater.

As shown, each contact 512A, 512B may have a respective mating end 518A, 518B, a respective first lead portion 522A, 522B extending from the mating end 518A, 518B, a respective mounting portion 516A, 516B, and a respective second lead portion 521A, 521B extending from the mounting portion 516A, 516B. The first lead portion 522A, 522B may form a first angle (e.g., 135°) with the second lead portion 521A, 521B. The mounting portions 516A of the contacts 512A may extend in a first direction (e.g., to the left as shown in FIG. 5A), at a second angle (e.g., 135°) with respect to the respective lead portions 521A of the contacts 512A. The mounting portions 516B of the contacts 512B may extend in the same direction (e.g., to the left as shown in FIG. 5A) at a third angle (e.g., 45°) with respect to the respective lead portions 521B of the contacts 512B. Thus, when the leadframe housing is folded onto itself, the mounting portions 512A, 512B will extend in opposite directions relative to one another.

Figure 5B:
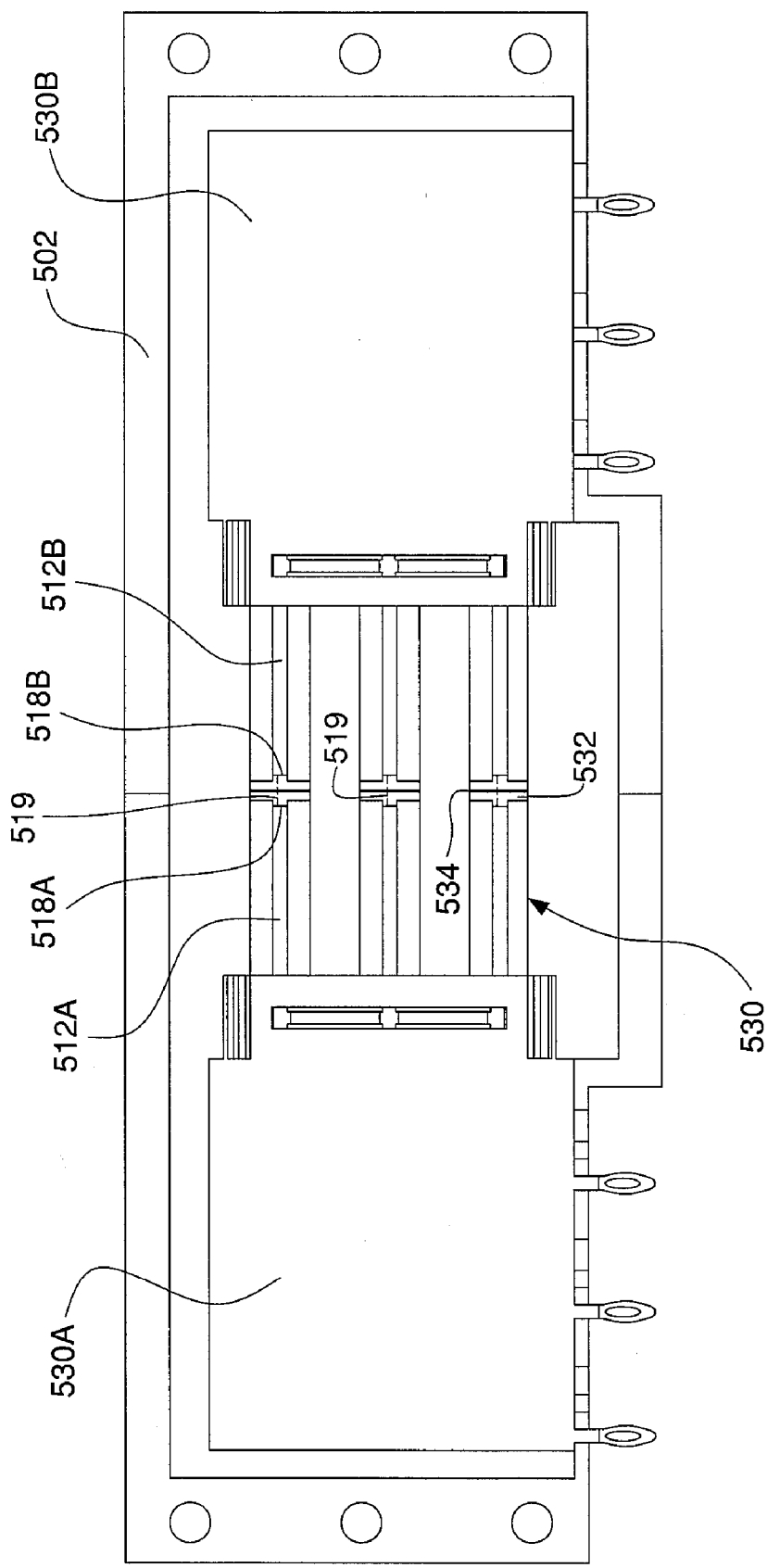

A dielectric leadframe housing 530, comprising two half-portions 530A, 530B connected by one or more hinges 534, may be molded onto the leadframes 510A, 510B using well-known injection molding techniques. FIG. 5B depicts a molded leadframe assembly with the carrier frame 502 still attached thereto. As shown, the contact mating ends 518A, 518B need not be surrounded by plastic, though they could be. The leadframe housing 530 may define notches 532 in the dielectric material proximate the contact mating ends 518A, 518B. The outer broadsides of the contacts 512A, 512B may extend beyond the outer face of the mating portion of the leadframe housing 530 (e.g., out of the page as depicted in FIG. 5B). Some dielectric housing material may be allowed to wrap around the contact edges to prevent the contact from falling out of its channel.

The contacts may be held by so-called "pinch pins" during the molding process so the contacts may held in a desired position between the front and back surfaces of the leadframe housing. The distance between the back broadside of the contact and the back surface of the leadframe housing may be half of the gap between the contact pair in the folded leadframe assembly.

The hinged portion may be defined as a notch 532 in the dielectric housing. The width of the notch 532 may be approximately equal to the thickness of the material used to form the mating portion of the leadframe housing. As shown, the notch 532 may be angled at about 45° on each side of the hinge. It should be understood that the wider the angle the more gradual the lead-in will be. The resiliency of the hinge is expected to be a function of the type of material used and of the thickness of the material at the hinge.

Figure 5C:
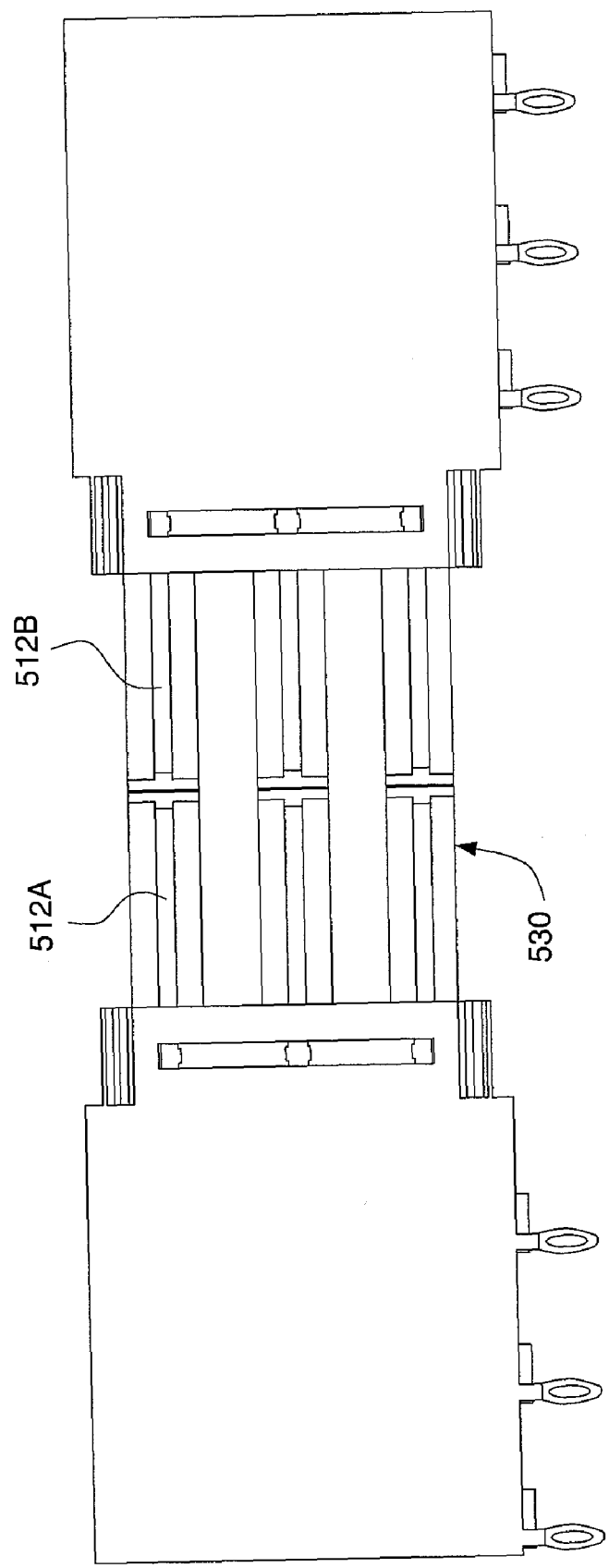
Figure 5D:
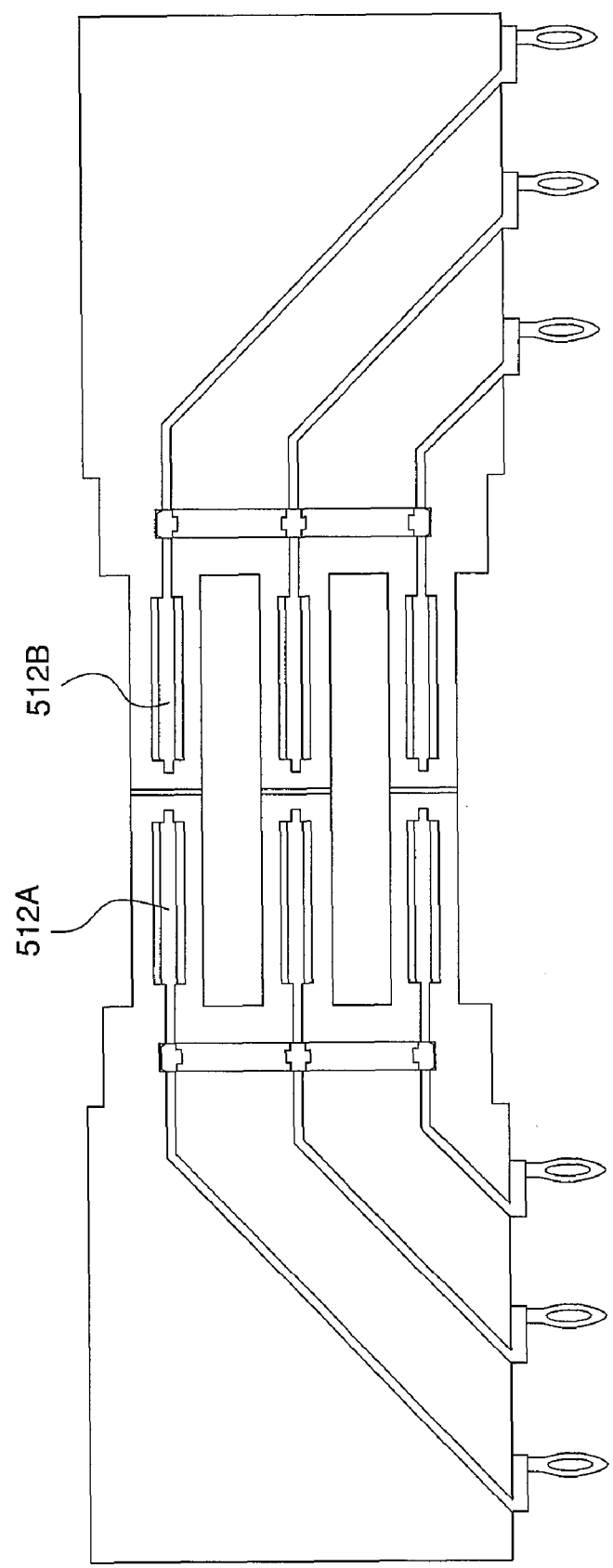

FIGS. 5C and 5D depict the molded leadframe assembly with the carrier strip removed. FIG. 5C depicts the top side of the molded leadframe assembly (which, when folded about the hinge, becomes the outer sides of the folded leadframe assembly). The mating portions of the contacts 512A, 512B may extend above the top face of the dielectric housing 530 (e.g., out of the page as shown in FIG. 5C).

Figure 6:
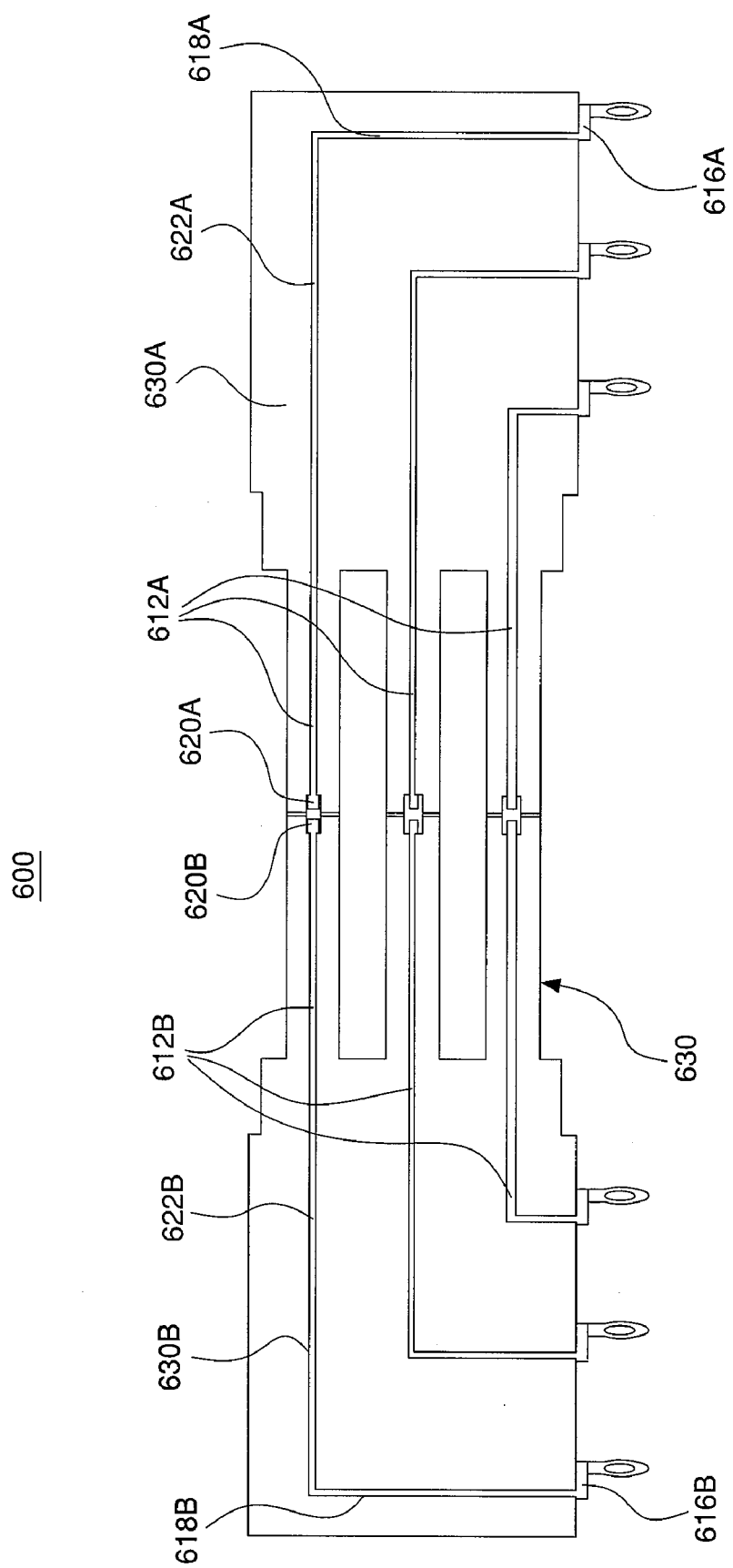
FIG. 6 depicts a second example embodiment of a leadframe carrier strip.

FIG. 6 depicts a hinged leadframe assembly 600 comprising a first column of electrical contacts 612A extending through a first portion 630A of a hinged leadframe housing 630, and a second column of electrical contacts 612B extending through a second portion 630B of the hinged leadframe housing 630. Each contact 612A, 612B has a mating end 620A, 620B, a first lead portion 622A, 622B extending from the mating end 620A, 620B, a mounting portion 616A, 616B, and a second lead portion 618A, 618B extending from the mounting portion 616A, 616B. The mounting portions 616A of the contacts 612A may extend in a first direction (e.g., to the right as shown in FIG. 6) perpendicular to the respective lead portions 618A of the contacts 612A. The mounting portions 616B of the contacts 612B may extend perpendicular to the respective lead portions 618B of the contacts 612B, in the same direction (e.g., to the right as shown in FIG. 6). Thus, when the leadframe housing 630 is folded onto itself, the mounting portions 616A, 616B will extend in opposite directions relative to one another. The second lead portions 618A, 618B may extend at right angles (e.g., 90°) from the corresponding first lead portions 622A, 622B.

It should be understood that any number of other contact configurations are possible. For example, each contact may have a mating end, a first lead portion extending from the mating end, a mounting portion, a second lead portion extending from the mounting portion, and a third lead portion extending between the second lead portion and the first lead portion. The third lead portion may make a first angle with the first lead portion and a second angle with second lead portion.

The leadframe assembly may be folded about the hinge and inserted into the connector housing such that the dovetail is received into the dovetail receptacle. As described in detail above, the dovetail contains the leadframe assembly in the connector housing, and causes the halves of the leadframe assembly to be pressed, and remain pressed, tightly against each other after assembly into the connector housing. Features other than dovetails may also hold the leadframe assemblies before insertion into the housing.

A leadframe assembly thus folded onto itself is expected to provide better tolerance in terms of the positional relationship between the contacts that form a differential signal pair. For example, the contacts may be aligned with as much broadside facing each other as possible, and the gap width between the contacts may be made substantially constant along the lead portions of the contacts. Consequently, the contact pair may have a substantially uniform differential impedance profile from the mating ends of the contacts to the mounting ends thereof. Thus, a folded leadframe assembly as described herein may provide for excellent control of gap tolerances compared to assembling two separate pieces, which may tend to provide for better control of differential impedance. Also, the molded hinge at the mating end of the leadframe housing, and the dielectric material surrounding the mating ends of the contacts, provide for a very robust header mating interface that will be strong compared to bare contacts.

What is claimed:

1. A leadframe assembly for an electrical connector, the leadframe assembly comprising:
   a dielectric leadframe housing, and
   first and second electrically-conductive contacts extending through the leadframe housing,
   wherein each of the first and second contacts has a respective mating end, and the leadframe housing defines a hinge between the mating ends of the first and second contacts.

2. The leadframe assembly of claim 1, wherein the leadframe housing defines a first portion and a second portion, and wherein the hinge is a linear hinge defined by an intersection of the first and second portions of the leadframe housing.

3. The leadframe assembly of claim 1, wherein the leadframe housing defines a first portion and a second portion, and wherein each of the first and second portions of the leadframe housing defines a respective half of a dovetail.

4. The leadframe assembly of claim 1, wherein the mating ends of the contacts define a gap between them, and the hinge is formed in the gap.

5. The leadframe assembly of claim 1, wherein the mating ends of the contacts extend out of a recess in a mating portion of the leadframe housing.

6. The leadframe assembly of claim 1, wherein the mating ends of the contacts have sloped lead-in surfaces.

7. The leadframe assembly of claim 1, wherein the hinge is defined by a notch in the leadframe housing.

8. The leadframe assembly of claim 1, wherein the first contact defines a first broadside that extends along a first direction and the second contact defines a second broadside that extends along the first direction, and wherein the first and second broadsides are adjacent to each other along a second direction that is orthogonal to the first direction.

9. The leadframe assembly of claim 1, wherein the first and second contacts form a differential signal pair.

10. The electrical connector of claim 4, wherein the gap provides for a uniform differential impedance profile between the first and second contacts.

11. The electrical connector of claim 8, wherein the first and second broadsides comprise an air gap therebetween.

12. The electrical connector of claim 8, wherein the first and second broadsides comprise plastic therebetween.

13. The electrical connector of claim 9, wherein an impedance is defined by the differential signal pair, and wherein the impedance is about 85±10 ohms.

14. The electrical connector of claim 9, wherein an impedance is defined by the differential signal pair, and wherein the impedance is about 100±10 ohms.

15. An electrical connector comprising: p1 a leadframe assembly, wherein the leadframe assembly includes a dielectric leadframe housing, and first and second electrically-conductive contacts extending through the leadframe housing, and
   wherein the first contact comprises a first mating portion and the second contact comprises a second mating portion, and the leadframe housing defines a hinge between the first and second mating portions of the first and second contacts.

16. The leadframe assembly of claim 15, wherein the first contact defines a first broadside that extends along a first direction and the second contact defines a second broadside that extends along the first direction, and wherein the first and second broadsides are adjacent to each other along a second direction that is orthogonal to the first direction.

17. The leadframe assembly of claim 16, wherein the first and second contacts form a differential signal pair.

18. The electrical connector of claim 15, wherein the first and second mating portions of the contacts define a gap therebetween, and wherein the hinge is disposed in the gap.

19. The electrical connector of claim 18, wherein the first mating portion comprises a first mating end and a first lead portion extending from the first mating end and the second mating portion comprises a second mating end and a second lead portion extending from the second mating end, and wherein the gap is constant between the first and second mating ends and the first and second lead portions of the contacts.

20. The electrical connector of claim 16, wherein the first and second broadsides comprise an air gap therebetween.

21. The electrical connector of claim 16, wherein the first and second broadsides comprise plastic therebetween.

22. The electrical connector of claim 17, wherein an impedance is defined by the differential signal pair, and wherein the impedance is about 85±10 ohms.

23. The electrical connector of claim 17, wherein an impedance is defined by the differential signal pair, and wherein the impedance is about 100±10 ohms.

24. The electrical connector of claim 18, wherein the gap provides for a uniform differential impedance profile between the first and second contacts.

25. An electrical connector comprising:
   a leadframe assembly comprising a dielectric leadframe housing having first and second portions, and first and second electrically-conductive contacts,
   wherein the first contact extends through the first portion and the second contact extends through the second portion of the dielectric leadframe housing, and wherein the leadframe housing defines a hinge between the first and second portions.

26. The electrical connector of claim 25, wherein the first and second contacts form a differential signal pair.

27. The electrical connector of claim 25, wherein the first contact defines a first broadside that extends along a first direction and the second contact defines a second broadside that extends along the first direction, and wherein the first and second broadsides are adjacent to each other along a second direction that is orthogonal to the first direction.

28. The electrical connector of claim 25, wherein the first contact comprises a first mating end and a first lead portion extending from the first mating end and the second contact comprises a second mating end and a second lead portion extending from the second mating end, wherein the first and second contacts define a gap there between, and wherein the gap is constant between the first and second lead portions.

29. The electrical connector of claim 28, wherein the hinge is disposed in the gap between the first and second mating ends.

30. The electrical connector of claim 25, wherein the first portion of the leadframe housing is a mirror image of the second portion of the leadframe housing.

31. The electrical connector of claim 26, wherein an impedance is defined by the differential signal pair, and wherein the impedance is about 85±10 ohms.

32. The electrical connector of claim 26, wherein an impedance is defined by the differential signal pair, and wherein the impedance is about 100±10 ohms.

33. The electrical connector of claim 27, wherein the first and second broadsides comprise an air gap therebetween.

34. The electrical connector of claim 27, wherein the first and second broadsides comprise plastic therebetween.

35. The electrical connector of claim 28, wherein the gap provides for a uniform differential impedance profile between the first and second contacts.

* * * * *